US012757703B2

(12) United States Patent
Howder et al.

(10) Patent No.: US 12,757,703 B2
(45) Date of Patent: Oct. 6, 2026

(54) STAIRCASE STRUCTURES FOR ACCESSING THREE-DIMENSIONAL MEMORY ARRAYS

(71) Applicant: Micron Technology, Inc., Boise, ID (US)

(72) Inventors: Collin Howder, Boise, ID (US); Martin Jared Barclay, Middleton, ID (US); Harsh Narendrakumar Jain, Boise, ID (US); Yiping Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 959 days.

(21) Appl. No.: 17/812,616

(22) Filed: Jul. 14, 2022

(65) Prior Publication Data

US 2024/0021521 A1 Jan. 18, 2024

(51) Int. Cl.
*H01L 27/11582* (2017.01)
*G11C 11/34* (2006.01)
(Continued)

(52) U.S. Cl.
CPC ............. *H10W 20/20* (2026.01); *G11C 16/08* (2013.01); *H10B 41/41* (2023.02); *H10B 43/40* (2023.02)

(58) Field of Classification Search
CPC .... H10N 70/823; H10N 70/231; H10N 70/20; H10N 70/8833; H10N 70/826; H10N 70/245; H10N 70/066; H10N 70/8828; H10N 70/8825; H10N 70/063; H10N 70/882; H10N 70/011; H10N 70/841; H10N 70/021; H10N 70/8836; H10N 70/828; H10N 70/026; H10N 70/801; H10N 70/8822; H10N 70/041; H10N 70/24; H10N 70/821; H10N 70/8265; H10N 70/883; H10N 70/25; H10N 70/881; H10N 70/884; H10N 50/01; H10N 70/8845; H10N 50/10; H10N 70/023; H10N 70/8416; H10N 70/061; H10N 70/253; H10N 50/80; H10N 70/028; H10N 70/8413; H10N 70/8418;
(Continued)

(56) References Cited

U.S. PATENT DOCUMENTS 9,853,043 B2 * 12/2017 Lu .......................... H10B 43/27
10,559,337 B1 * 2/2020 Redaelli ................. H10B 53/50
(Continued)

*Primary Examiner* — Leonard Chang
*Assistant Examiner* — Tsz K Chiu
(74) *Attorney, Agent, or Firm* — Holland & Hart LLP

(57) ABSTRACT

Methods, systems, and devices for staircase structures for accessing three-dimensional (3D) memory arrays are described. A memory system may include an access region (e.g., a staircase region) that includes circuitry for accessing memory cells at respective levels of memory cells. The access region may include a channel through which a conductive pillar may couple a word line at a level of memory cells with decoder circuitry. During manufacture of the memory system, a channel material may be formed in the channel and etched to form a corner portion in the channel. During a partitioning of the channel, a nitride material over the corner portion may be etched and some of the corner portion may remain in the channel, which may prevent formation of a trench that may cause the conductive pillar to be uncoupled from the word line.

9 Claims, 6 Drawing Sheets

(51) Int. Cl.

| | |
|---|---|
| ***G11C 16/08*** | (2006.01) |
| ***G11C 16/24*** | (2006.01) |
| ***H01L 27/1157*** | (2017.01) |
| ***H10B 41/41*** | (2023.01) |
| ***H10B 43/40*** | (2023.01) |
| ***H10W 20/20*** | (2026.01) |

(58) Field of Classification Search

CPC ........ H10B 43/27; H10B 41/27; H10B 43/35; H10B 41/35; H10B 43/10; H10B 43/40; H10B 41/10; H10B 41/41; H10B 43/20; H10B 43/50; H10B 63/845; H10B 41/50; H10B 51/50; H10B 63/34; H10B 69/00; H10B 41/20; H10B 63/80; H10B 41/00; H10B 41/40; H10B 53/20; H10B 63/22; H10B 63/24; H10B 80/00

See application file for complete search history.

(56) References Cited

U.S. PATENT DOCUMENTS

| | | | | |
|---|---|---|---|---|
| 10,636,812 | B1 * | 4/2020 | Lai | G11C 11/5628 |
| 11,729,997 | B2 * | 8/2023 | Lin | H10D 84/0149 |
| 2009/0309152 | A1 * | 12/2009 | Knoefler | H10B 43/30 438/257 |
| 2016/0240254 | A1 * | 8/2016 | Chen | H10B 43/27 |
| 2021/0143100 | A1 * | 5/2021 | Chakravarthi | H10W 20/20 |
| 2021/0384354 | A1 * | 12/2021 | Karda | H10D 30/6755 |
| 2023/0413542 | A1 * | 12/2023 | Xu | H10B 41/27 |

* cited by examiner

400

STAIRCASE STRUCTURES FOR ACCESSING THREE-DIMENSIONAL MEMORY ARRAYS

FIELD OF TECHNOLOGY

The following relates to one or more systems for memory, including staircase structures for accessing three-dimensional (3D) memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not- or (NOR) and not- and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
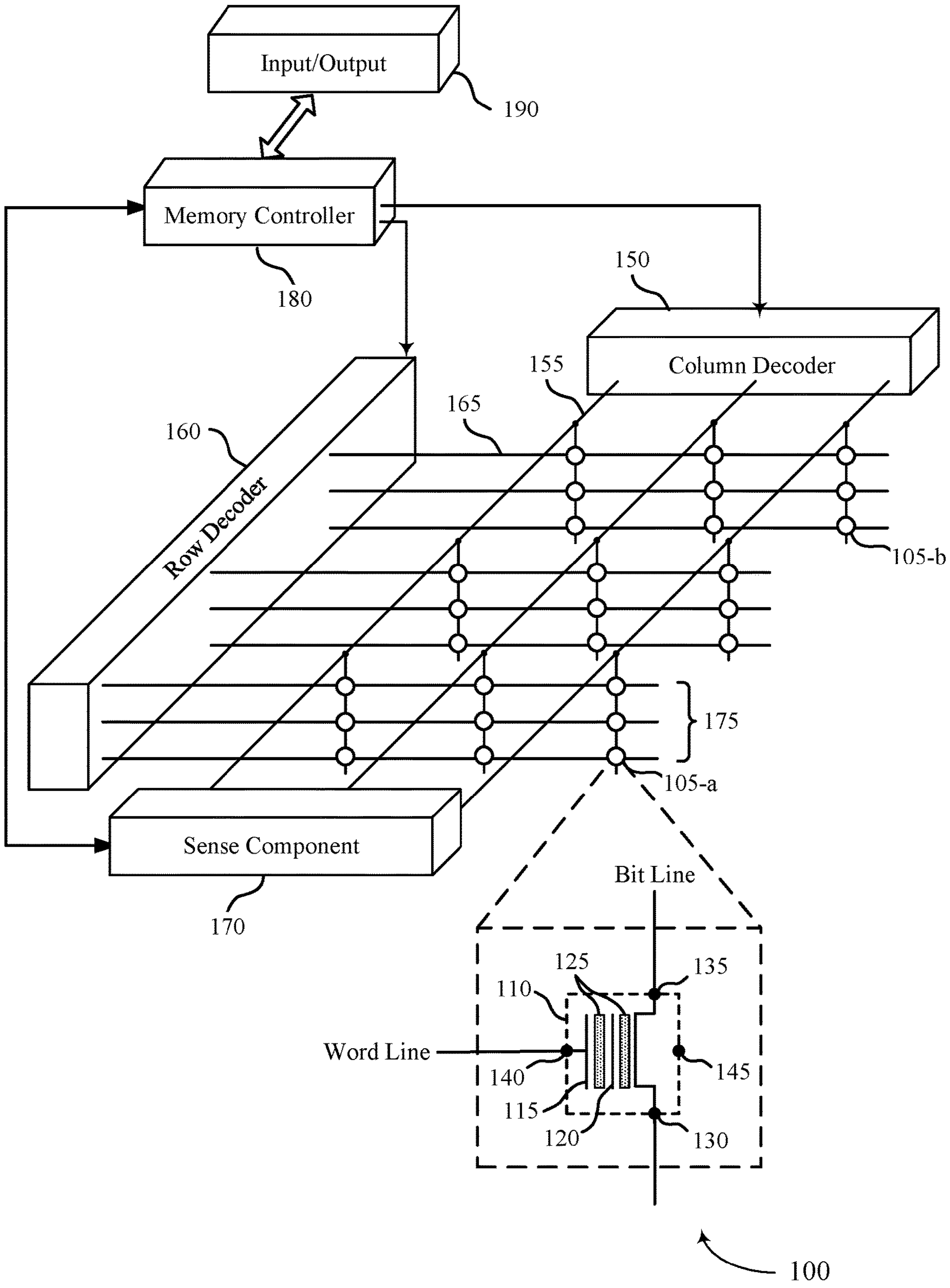
FIG. 1 illustrates an example of a system that supports staircase structures for accessing three-dimensional (3D) memory arrays in accordance with examples as disclosed herein.

Memory devices may include one or more arrays of memory cells and associated circuitry over a substrate. For example, a memory device may include three-dimensional (3D) arrays of memory cells that are arranged in levels (e.g., layers, decks, tiers) of memory cells. In some examples, the memory device may include access circuitry (e.g., word lines, digit lines) located at various levels, if not each level, of memory cells to support accessing memory cells located at respective levels. To couple the access circuitry with various control circuitry (e.g., configured to bias the access circuitry to various voltages), the memory device may include a staircase region that may include conductive pillars used to couple a word line at a given level with the control circuitry. Reducing the physical area occupied by the staircase region may support the inclusion of additional levels of memory cells in the memory device, and thus may increase memory storage capacity without increasing the physical area (e.g., lateral area) occupied by the memory device.

Various manufacturing operations may be utilized to reduce the occupied area of the staircase channel. For example, the staircase region may include various channels that may each include a conductive pillar extending through the channel and to a respective word line to couple the word line with the control circuitry. To reduce the staircase region area, channels in the staircase region may be bisected such that twice as many conductive pillars may be included in the same amount of space. For example, based on bisecting a channel, a first conductive pillar in the channel may extend to and be coupled with a first word line at a first level of memory cells, and a second conductive pillar in the channel may extend to a second word line at a second level of memory cells. However, when etching the channel to bisect it, a trench may be formed that results in electrical isolation, or physical isolation, or both of one or more of the conductive pillars to a word line at the level of the memory cell where the trench is located (e.g., electrically isolating, or physically isolating, or both the second conductive pillar from the second word line such that the second conductive pillar is uncoupled from the second word line). As such, the word line may not be used to access memory cells, thereby preventing the benefits of the staircase bisection from coming to fruition and resulting in reduced storage capacity and wasted space, for example, due to some memory cells being inaccessible.

In accordance with the examples herein, a memory device may include a deposited barrier material located in a partitioned (e.g., bisected) channel of a staircase region between a conductive pillar and a channel sidewall to prevent unwanted trench formation, among other benefits. For example, to support bisecting the channel, a material (e.g., a material including nitride) may be deposited in the channel with one side of the material (e.g., one half of the nitride, one portion of the nitride) being implanted with another material, such as a material including carbon (e.g., corresponding to one side of the bisected channel). The non-implanted and implanted material (e.g., nitride) may be subsequently etched such that the material (e.g., nitride) may be removed and the side of the channel that was covered by the non-implanted nitride may be etched down, for example, to a next level of memory cells relative to the side of the channel that was covered by the implanted material (e.g., nitride), thereby bisecting the channel. Before the material (e.g., nitride) is deposited, another material such a material included oxide (e.g., among other materials described herein) may be formed in one or more bottom corners of the channel (and may be referred to as a corner material such as a corner oxide) such that trench formation in the corner of the channel may be prevented or at least inhibited. For example, the nitride deposited over the corner oxide may be implanted at a greater rate than the nitride deposited on the sidewalls of the channel, which will result in a greater resistance to being processed, (e.g., etched) during processing of the non-implanted nitride material. Additionally or alternatively, the corner oxide itself will function as an additional barrier to the formation of the trench during bisection of the channel. Thus, the use of the corner oxide will prevent a trench from forming in the corner of the channel when the channel is subsequently bisected. As such, the channel will be bisected while still supporting access to word lines at each level, thereby supporting increased storage capacity of the memory device without increasing the physical area occupied by the memory device (e.g., the staircase region), among other benefits.

Figure 2:
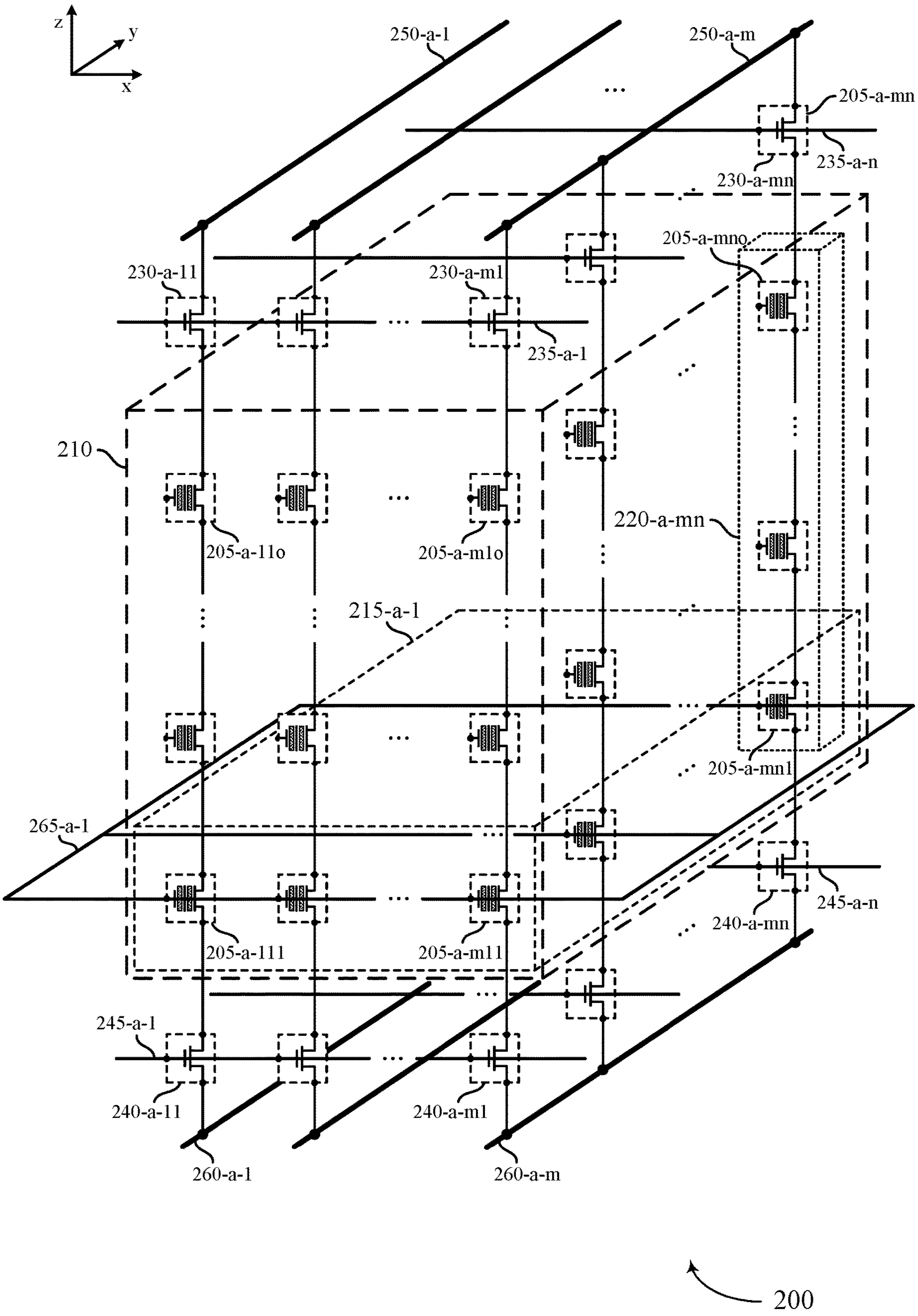
FIG. 2 illustrates an example of a memory architecture that supports staircase structures for accessing 3D memory arrays in accordance with examples as disclosed herein.

Features of the disclosure are initially described in the context of systems, devices, and circuits with reference to FIGS. 1 and 2. Features of the disclosure are described in the context of a layout with reference to FIGS. 3A through 3F. These and other features of the disclosure are further illustrated by and described with reference to a flowchart that relates to staircase structures for accessing 3D memory arrays as described with reference to FIG. 4.

FIG. 1 illustrates an example of a memory device 100 that supports staircase structures for accessing 3D memory arrays in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-*a* and memory cell 105-*b*. In some examples, a memory cell 105 may be a NAND memory cell, such as in the blow-up diagram of memory cell 105-*a*. Each memory cell 105 may be programmed to store a logic value representing one or more bits of information. In some examples, a single memory cell 105—such as a memory cell 105 configured as a single-level cell (SLC) —may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-*a* that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-*a* is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another and may be generically referred to as access lines or select lines.

In some cases, a memory device 100 may include a 3D memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. Upon accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some examples, the memory device 100 may include access circuitry (e.g., word lines 165, bit lines 155, select lines) located at each level of memory cells 105. In order to couple the access circuitry with various control circuitry, the memory device 100 may include a staircase region (e.g., a channel) that may support accessing the memory cells 105. For example, one or more conductive pillars in the staircase region may be utilized to couple the word lines 165 with the row decoder 160.

In accordance with the examples herein, the memory device 100 may include a deposited barrier material located in a partitioned (e.g., bisected) channel of the staircase region between one or more conductive pillars and staircase sidewalls to support proper function of the memory device 100. For example, nitride may be deposited in the staircase channel with one side of the nitride being implanted with carbon. Before the nitride is deposited, the barrier material may be formed in one or more bottom corners of the channel such that the nitride deposited over the corner barrier material (e.g., the corner oxide) may be implanted at a greater rate than the nitride deposited on the sidewalls of the channel. Additionally or alternatively, the corner barrier material itself may function as an additional barrier, for example, to prevent a trench from forming when the channel is subsequently etched and bisected. As such, the channel may be bisected while still supporting access to word lines 165 at each level. Thus, an increased storage capacity of the memory device 100 may be supported without increasing the physical area occupied by the staircase region.

FIG. 2 illustrates an example of a memory architecture 200 that supports staircase structures for accessing 3D memory arrays in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood by a person having ordinary skill in the art to be similar. Aspects of the memory architecture 200 may be described with reference to an x-direction, a y-direction, and a z-direction of the illustrated coordinate system.

In the example of memory architecture 200, the block 210 may be divided into a set of pages 215 (e.g., a quantity of o pages 215) along the z-direction, including a page 215-*a*-1 associated with memory cells 205-*a*-111 through 205-*a*-*mn*1. In some examples, each page 215 may be associated with a same word line 265, (e.g., a word line 165 described with reference to FIG. 1), which may be coupled with a control gate 115 of each of the memory cells 205 of the page 215. For example, page 215-*a*-1 may be associated with a word line 265-*a*-1, and other pages 215-*a*-1 may be associated with a different respective word line 265-*a*-*i* (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-*a*-*mn* associated with memory cells 205-*a*-*mn*1 through 205-*a*-*mno*. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from in accordance with a granularity, such as at the granularity of the page 215, but may not be erasable (e.g., reset to a logic 1 value) in accordance with the granularity, such as the granularity of the page 215. For example, NAND memory may instead be erasable in accordance with a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of a block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistor 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistor 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, voltages may be concurrently applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 (e.g., a pillar channel) may be electrically connected with (e.g., electrically connected between) the corresponding bit line 250 and source line 260. A channel may be an electrical path through the memory cells 205 in the string 220 (e.g., through the sources and drains of the transistors in the memory cells 205 of the string 220) that may conduct current under some operating conditions.

In some examples, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1) and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-*a* of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-*a* of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some cases, electron injection and removal processes associated with program and erase operations may cause stress on a memory cell 205 (e.g., on the dielectric material 125). Over time, such stress may in some cases cause one or more aspects of the memory cell 205 (e.g., the dielectric material 125) to deteriorate. For example, charge trapping structure 120 may become unable to maintain a stored charge. Such deterioration may be an example of a wearout mechanism for a memory cell 205, and for this or other reasons, some memory cells 205 may support a finite quantity of program and erase cycles.

In accordance with the examples herein, a memory device that includes the memory architecture 200 may include a deposited barrier material located in a partitioned channel of a staircase region between one or more of conductive pillars and channel sidewalls to support proper memory device function. For example, the memory device may include access circuitry (e.g., word lines 265, bit lines 250, select lines 235, select lines 245, source lines 260) located at the levels of memory cells 205. In order to couple the access circuitry with various control circuitry (e.g., decoder circuitry, such as a row decoder 160, a column decoder 150, a sense component 170 described with reference to FIG. 1), the memory device may include a staircase region (e.g., a channel) that may include one or more conductive pillars used to couple the access circuitry (e.g., a word line 265) at a given level with the control circuitry. To support partitioning the channel, nitride may be deposited in the channel with one side of the nitride being implanted with carbon. Before the nitride is deposited, the barrier material may be deposited in one or more bottom corners of the channel such that trench formation in the corner of the channel may be prevented. For example, the nitride deposited over the barrier material in the bottom corner may be implanted at a greater rate than the nitride deposited on the sidewalls of the channel, which may result in a greater resistance to being etched during an etch of non-implanted nitride material. Additionally or alternatively, the corner oxide itself may function as an additional barrier to the formation of the trench during bisection of the channel. Thus, the use of this corner oxide may prevent a trench from forming when the channel is subsequently etched and partitioned. As such, the staircase channel may be bisected while still supporting access to word lines 265 at each level. Thus, an increased storage capacity of the memory device may be supported without increasing the physical area occupied by the staircase channel.

FIGS. 3A through 3F illustrate examples of operations that support a staircase structures for accessing 3D memory arrays in accordance with examples as disclosed herein. For example, FIGS. 3A through 3F may illustrate aspects of a sequence of manufacturing operations for fabricating aspects of a layout 300, which may be a portion of a memory device (e.g., a portion of a memory device 100, a portion of a memory architecture 200). Each view of the FIGS. 3A through 3F may be described with reference to an x-direction, a y-direction, and a z-direction, as illustrated. The manufacturing operations illustrate various cross-sectional views of the layout 300. For example, the manufacturing operations illustrate cross-sectional views of the layout 300 in an xz-plane through the layout 300. Although the layout 300 illustrates examples of certain relative dimensions and quantities of various features, aspects of the layout 300 may be implemented with other relative dimensions or quantities of such features in accordance with examples as disclosed herein.

Operations illustrated in and described with reference to FIGS. 3A through 3F may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Additionally, it is noted that the aspects of the manufacturing operations are described with reference to bisecting a channel of a staircase region, for clarity. However, the techniques described herein may be adapted and applied to support other partitioning of the channel, such as trisecting the channel, quadrisecting the channel, and so on.

Figure 3A:
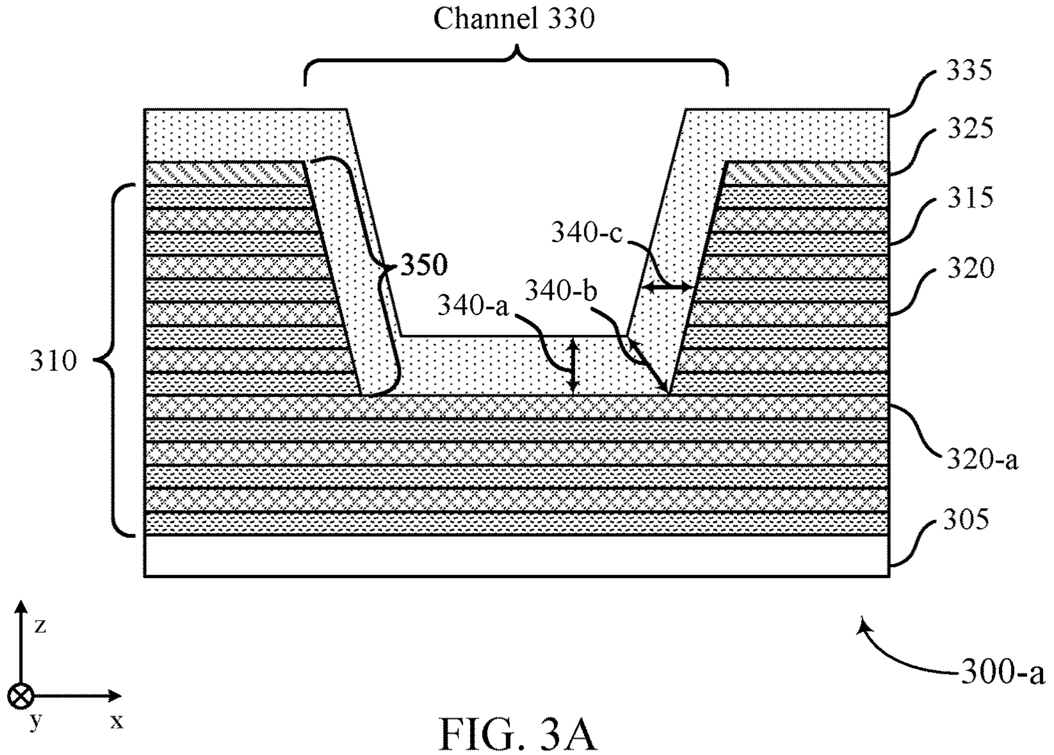
FIGS. 3A, 3B, 3C, 3D, 3E, and 3F illustrate examples of layouts that support staircase structures for accessing 3D memory arrays in accordance with examples as disclosed herein.

FIG. 3A illustrates a portion of a layout 300-*a* after a first set of one or more manufacturing operations. The first set of manufacturing operations may include forming various structures and materials over a substrate 305. The substrate 305 may be a semiconductor wafer or other substrate over which a stack of layers 310 is formed (e.g., deposited). The stack of layers 310 may include alternating layers of a first material and a second material. For example, the first material in the stack of layers 310 may be a sacrificial material 320 and the second material in the stack of layers 310 may be a dielectric material 315. In some examples, the sacrificial material 320 may be a nitride material and may be subsequently removed (e.g., etched) and replaced by a conductive material to form word lines (e.g., word lines 165, word lines 265). The quantity of layers depicted in the stack of layers 310 may be solely for illustrative purposes. For example, the stack of layers 310 may include any quantity of layers of the dielectric material 315 and the sacrificial material 320, including more or less layers than those illustrated.

Various other layers of materials may be formed over (e.g., on, above) the stack of layers 310 (e.g., in the z-direction, which is orthogonal to the substrate 305). For example, a top dielectric material 325 may be formed over the stack of layers 310. In some examples, the top dielectric material 325 may be excluded from the layout 300.

The stack of layers 310 may form the basis for a staircase region that includes access circuitry for accessing memory cells at respective levels of memory cells included in the memory device. In some examples, to support the formation and coupling of such access circuitry, the first set of manufacturing operations may include removing (e.g., etching) a portion of the stack of layers 310 in the z-direction to create (e.g., form) a channel 330. For example, the channel 330 may be formed in the stack of layers 310 by etching portions of layers of the dielectric material 315 and the sacrificial material 320. In some other examples, the channel 330 may be formed as the layers of the stack of layers 310 are formed (e.g., deposited), for example, by using a mask as additional layers over a base layer that is the bottom of the channel 330 (e.g., a sacrificial material 320-*a*) are deposited.

In some examples, a bottom of the channel 330 may include (e.g., correspond to, be) a top surface of a portion of a layer of the dielectric material 315. For example, the bottom of the channel 330 may be a top surface of a portion (e.g., an exposed portion) of a sacrificial material 320-*a*. Additionally, the sides (e.g., sidewalls 350) of the channel 330 may include (e.g., correspond to, be) the alternating layers of the dielectric material 315 and the sacrificial material 320 that are over the base layer (e.g., the sacrificial material 320-*a*) in the z-direction. For example, the sidewalls 350 of the channel 330 may be the exposed sidewalls of the alternating layers of the dielectric material 315 and the sacrificial material 320 that are over the sacrificial material 320-*a*. In some examples, the junctions between the bottom of the channel 330 and the sidewalls 350 may be referred to as corners (e.g., bottom corners) of the channel 330. For example, the channel 330 may include a first bottom corner at the junction of a first sidewall 350 and the sacrificial material 320-*a* and a second bottom corner at the junction of a second sidewall 350 and the sacrificial material 320-*a*. The first set of manufacturing operations may further include forming (e.g., depositing) a material in the channel 330 (e.g., and over the stack of layers 310, over the top dielectric material 325). For example, a channel material 335 may be deposited in the channel 330 such that a film is deposited over the bottom and sidewalls 350 of the channel 330 and the top dielectric material 325 on top of the stack of layers 310 (e.g., or a top layer of the stack of layers 310 in the z-direction). In some examples, the channel material 335 may be in contact with the surfaces of the channel 330 (e.g., the bottom and sidewalls 350 of the channel 330) and the top dielectric material 325. In some examples, an intermediate layer (not shown) may be deposited such that it is located between the channel material 335 and the surfaces of the channel 330 and top dielectric material 325.

In some examples, the thickness of the deposited channel material 335 between the surface of the deposited channel material 335 and the surface of the junction between the bottom and sidewalls 350 of the channel 330 (e.g., a distance 340-*b*) may be greater than that of the thickness of the deposited channel material 335 between the surface of the channel material 335 and the bottom of the channel (e.g., a distance 340-*a*) and greater than the thickness of the channel material 335 between the surface of the channel material 335 and the sidewall of the channel (e.g., a distance 340-*c*). That is, the distance 340-*b* may be greater than the distance 340-*a*, and the distance 340-*b* may be greater than the distance 340-*c*. This variation in thickness of the channel material 335 may enable a portion of the channel material 335 to remain in the channel 330 after subsequent etches (e.g., as described with reference to FIG. 3B). In some examples, the variation in thickness of the channel material 335 (e.g., the greater quantity of channel material 335 being deposited in the corners of the channel 330) may be a natural result of an isotropic deposition of the channel material 335 in the channel 330 based on the geometry of the channel 330. That is, additional material deposited as part of an isotropic deposition operation may be deposited in corners of a geometrical space relative to other surfaces of the geometrical space.

In some examples, the channel material 335 may be an oxide material or another non-conductive spacer material. For example, the channel material 335 may be an oxide material such as silicon oxide, aluminum oxide, or a doped oxide (e.g., phosphorus-doped oxide, boron-doped oxide), among other types of oxide materials. Alternatively, the channel material 335 may be another non-conductive spacer material such as silicon nitride, or a non-conductive material having a high dielectric constant. In some examples, the channel material 335 may be associated with a relatively high etch rate (e.g., may be etched relatively quickly). In some examples, the channel material 335 may be a relatively inexpensive oxide material or non-conductive spacer material, for example, to mitigate costs associated with forming and etching the channel material 335.

Although the structures and materials are illustrated as being deposited in direct contact with the substrate 305, in some other examples, the layout 300-*a* may include other materials or components between the structures and materials and the substrate 305, such as interconnection or routing circuitry (e.g., access lines), control circuitry (e.g., transistors, aspects of a local memory controller, decoders, multiplexers), or other structures and materials (e.g., other structures and materials that have been processed in accordance with examples as disclosed herein), which may include various conductor, semiconductor, or dielectric materials between the structures and materials and the substrate 305. Additionally or alternatively, the layout 300-*a* may include a layer of intermediate material between the substrate 305 and the structures and materials, between the channel material 335 and the bottom of the channel 330, between the channel material 335 and the sidewalls 350 of the channel 330, or a combination thereof, among other locations where the intermediate material may be formed.

Figure 3B:
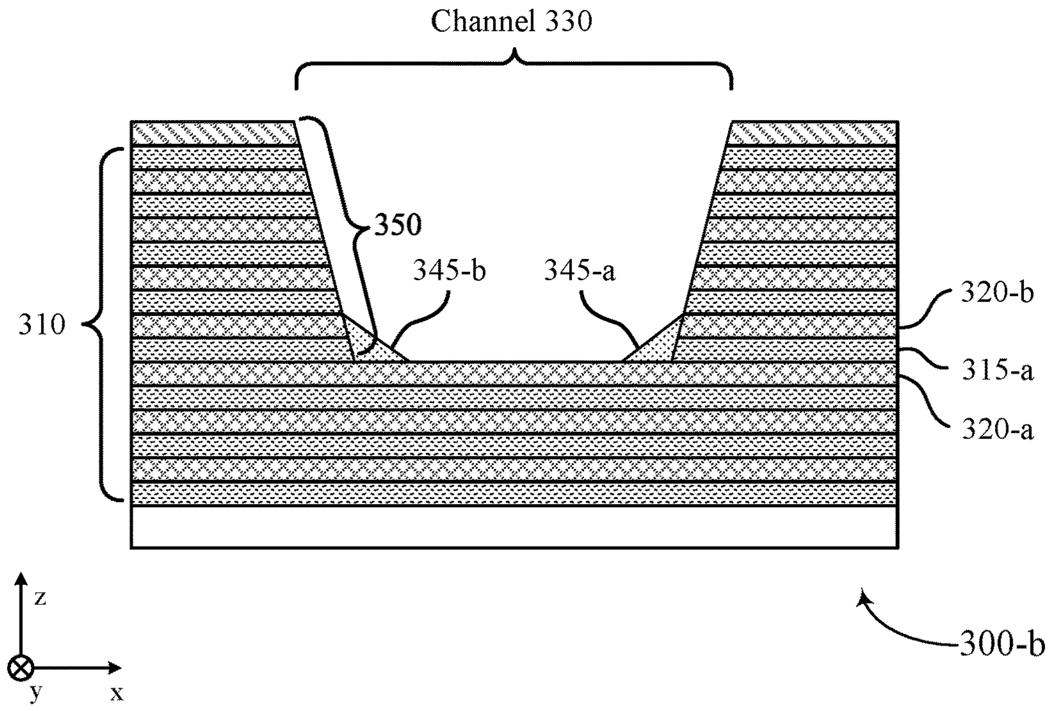

FIG. 3B illustrates a portion of a layout 300-*b* after a second set of one or more manufacturing operations. The second set of manufacturing operations may include further operations (e.g., wet etch operations, isotropic etch operations) that support staircase structures for accessing 3D memory arrays in accordance with examples as disclosed herein. For example, the second set of manufacturing operations may include removing (e.g., etching, such as via an isotropic wet etch) the channel material 335 from various portions of the channel 330, the top dielectric material 325, and other structures to form sub-structures. For example, the second set of manufacturing operations may include an etch of the channel material 335 to form a set of sub-portions of the channel material 335. These sub-portions may be referred to as corner oxides 345 (e.g., a corner oxide 345-*a*, a corner oxide 345-*b*), for clarity, however, it is understood that the sub-portions of the channel material 335 may be a material other than an oxide material as described with reference to FIG. 3A.

Etching the channel material 335 after its deposition may result in portions of the channel material 335 remaining in the bottom corners of the channel 330 (e.g., corner oxide 345-*a*, corner oxide 345-*b*). For example, the corner oxide 345-*a* may remain in the first bottom corner of the channel 330 and may be located over a portion of the sacrificial material 320-*a*. Similarly, the corner oxide 345-*b* may be located in the second bottom corner of the channel 330, which may be located opposite to the corner oxide 345-*a* (e.g., in the x-direction, which may be parallel to the substrate 305).

In some examples, the corner oxides 345-*a* and 345-*b* may also be adjacent to or in contact with one or more layers of the sidewalls 350 based on the extent to which the channel material 335 is etched. For example, in the example of FIG. 3B, the corner oxides 345 may be in contact with a dielectric material 315-*a* and a sacrificial material 320-*b*, although the corner oxides 345 may be in contact with (e.g., or adjacent to) any quantity of the layers of the sidewalls 350. In some examples, the corner oxides 345 may be adjacent to one or more layers of the sidewalls 350 but separated from the layers by one or more intermediate layers. In some examples, the corner oxide 345-*a* and the corner oxide 345-*b* may remain due to the greater amount of channel material 335 located in the bottom corners of the channel 330 relative to the amount of channel material 335 located along the sidewalls 350 of the channel 330 and the bottom of the channel 330, as described with reference to FIG. 3A. For example, the channel material 335 may be isotopically etched at a relatively constant rate. Accordingly, because the distance 340-*b* is greater than the distances 340-*a* and 340-*c*, at least some of channel material 335 may remain in the bottom corners of the channel 330 while being removed from elsewhere. Additionally, by varying the thickness of the deposited channel material 335 and the etch of the channel material 335 (e.g., a duration of the etch), a size of the corner oxides 345 may be varied and controlled.

In some examples, the second set of manufacturing operations may include exposing some portions of the surfaces of the channel 330 and top of the stack of layers 310 after etching. For example, a portion of the bottom of the channel 330 may be exposed between the corner oxides 345-*a* and 345-*b* based on the etching of the channel material 335. As such, the layers of the exposed portions of the bottom of the channel may include the sacrificial material 320-*a*. In some examples, if an intermediate material separates the corner oxides 345 from the sacrificial material 320-*a*, then a portion of the intermediate material located between the corner oxides 345 may be exposed. Additionally, the sidewalls 350 on either side of the channel 330 may be exposed above the corner oxides 345-*a* and 345-*b*. As such, some layers of the dielectric material 315 and some layers of the sacrificial material 320 of the stack of layers 310 over the corner oxides 345 in the z-direction may be exposed after the channel material 335 is etched. In some examples, if an intermediate material separates the corner oxides 345 from the sidewalls 350, then a portion of the intermediate material located over the corner oxides 345 in the z-direction and along the sidewalls 350 may be exposed. In some examples, the top dielectric material 325 (e.g., or a top layer of the stack of layers 310 in the z-direction) may also be exposed based on the etching.

Figure 3C:
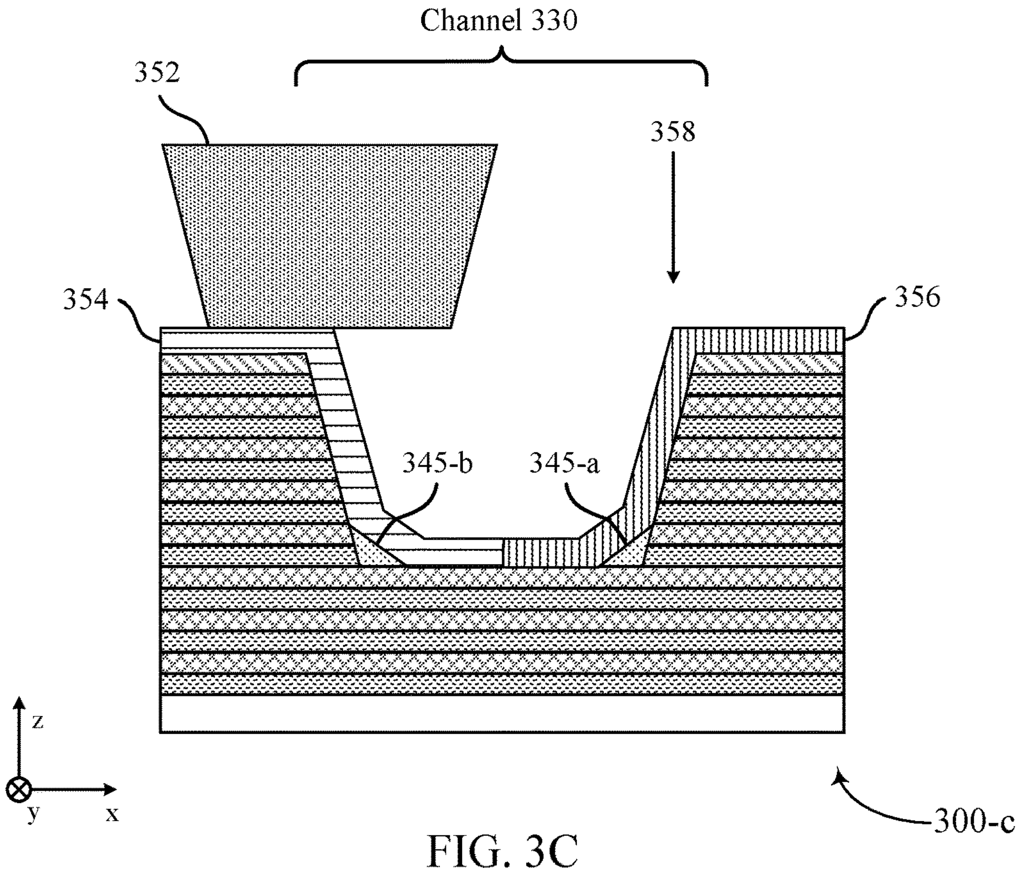

FIG. 3C illustrates a portion of a layout 300-*c* after a third set of one or more manufacturing operations. The third set of manufacturing operations may include further operations (e.g., deposition operations, implantation operations) that support staircase structures for accessing 3D memory arrays in accordance with examples as disclosed herein. For example, the third set of manufacturing operations may include the formation (e.g., deposition) of a nitride material 354 in the channel 330 and over the top dielectric material 325 and the formation of a mask 352. The third set of manufacturing operations may further include the implantation of a portion of the nitride material 354 with a doping material 358.

For example, the third set of manufacturing operations may include depositing a nitride material 354 (e.g., silicon nitride, among other nitride materials) in the channel 330 and over related aspects of such. In some examples, such as in the example of FIG. 3C, the nitride material 354 may be deposited in the channel 330 and may be deposited over and in contact with the corner oxide 345-*a*, the corner oxide 345-*b*, the exposed bottom of the channel 330, the exposed sidewalls of the channel 330, or a combination thereof. In such examples, the portion of the nitride material 354 deposited over the exposed bottom of the channel 330 (e.g., over the exposed top surface of the sacrificial material 320-*a*) may be located between the corner oxide 345-*a* and the corner oxide 345-*b*. In some other examples, the nitride material 354 may be separated from the corner oxide 345-*a*, the corner oxide 345-*b*, the bottom of the channel 330, the sidewalls of the channel 330, or a combination thereof, by one or more intermediate materials (not shown). The nitride material 354 may also be deposited over the top dielectric material 325 (e.g., or over the top layer of the stack layers 310 in the z-direction). In some examples, the material 354 may be a material other than a nitride material. For example, the material 354 may be a polysilicon material or an oxide material instead of a material that includes nitride.

In some examples, the third set of manufacturing operations may include subsequently forming (e.g., depositing) a mask 352 over a portion of the deposited nitride material 354. For example, the mask 352 may be formed on the nitride material 354 such that a first portion of the nitride material 354 may be shielded from further operations, such as implantation operation, etch operations, or deposition operations, among others, while mask 352 shields the portion of the nitride material 354.

In some examples, the third set of manufacturing operations may include implanting (e.g., doping) a second portion of the nitride material 354 with a doping material 358, such as carbon. For example, the third set of manufacturing operations may include an implant operation (e.g., doping operation) along the z-direction (e.g., negative z-direction) such that the nitride material 354 unblocked by the mask 352 in the z-direction (e.g., the second portion of the nitride material 354) may be implanted with the doping material 358 to form an implanted (e.g., doped) nitride material 356 (e.g., an implanted polysilicon material, an implanted oxide material based on the material 354). That is, the implanted nitride material 356 may be formed by implanting the second portion of the nitride material 354 with the doping material 358 (e.g., carbon). As a result of the implant operation, the nitride material 354 located over the corner oxide 345-*a* may be implanted, while the nitride material 354 located over the corner oxide 345-*b* may remain non-implanted.

In some examples, a distribution of the doping material 358 may vary throughout the implanted nitride material 356. For example, different portions of the implanted nitride material 356 may include (e.g., be implanted with) different quantities of the doping material 358. For instance, the implanted nitride material 356 located over the exposed surface of the bottom of the channel 330 may be implanted with a first quantity of the doping material 358 that is greater than a second quantity of the doping material 358 with which the implanted nitride material 356 located over the corner oxides 345-*a* and 345-*b* is implanted. Similarly, the second quantity of the doping material 358 may be greater than a third quantity of the doping material 358 with which the implanted nitride material 356 located over the first sidewall 350.

These differences in distribution may occur due to the different angles of the nitride-covered surfaces relative to a direction of the implanting with the doping material 358. For example, the effectiveness of the implant operation (e.g., the quantity of doping material 358 that is implanted) may increase as the direction of the implanting approaches orthogonality (e.g., 90°) with a surface of a given material. Similarly, the effectiveness of the implant operation may decrease as the direction of the implanting approaches parallelism (e.g., 0°, 180°). As a result, the first quantity of doping material 358 may be greater than the second quantity of doping material 358, and the second quantity of doping material 358 may be greater than the third quantity of doping material 358. For example, a first angle of the implanted nitride material 356 located over the exposed surface of the bottom of the channel 330 relative to the direction of the implanting may be approximately orthogonal. A second angle of the implanted nitride material 356 located over the first sidewall 350 relative to the direction of the implanting may approach parallelism (e.g., 0°) and may thus be less than the first angle. A third angle of the implanted nitride material 356 located over the corner oxide 345-*a* relative to the direction of the implanting may be between the first angle and the second angle (e.g., less than the first angle and greater than the second angle). Accordingly, the effectiveness of the implantation may be greatest for the implanted nitride material 356 located over the exposed surface of the bottom of the channel 330, then the implanted nitride material 356 located over the corner oxide 345-*a*, and then the implanted nitride material 356 located over the first sidewall 350.

In some examples, the third angle of the first sidewall may be steep enough relative to the angle of implantation (e.g., approach 0°) to render the implantation of the nitride material 354 on the first sidewall 350 relatively ineffective. In such cases, the implanted nitride material 356 located on the first sidewall 350 may have similar characteristics to that of the non-implanted nitride material 354.

Figure 3D:
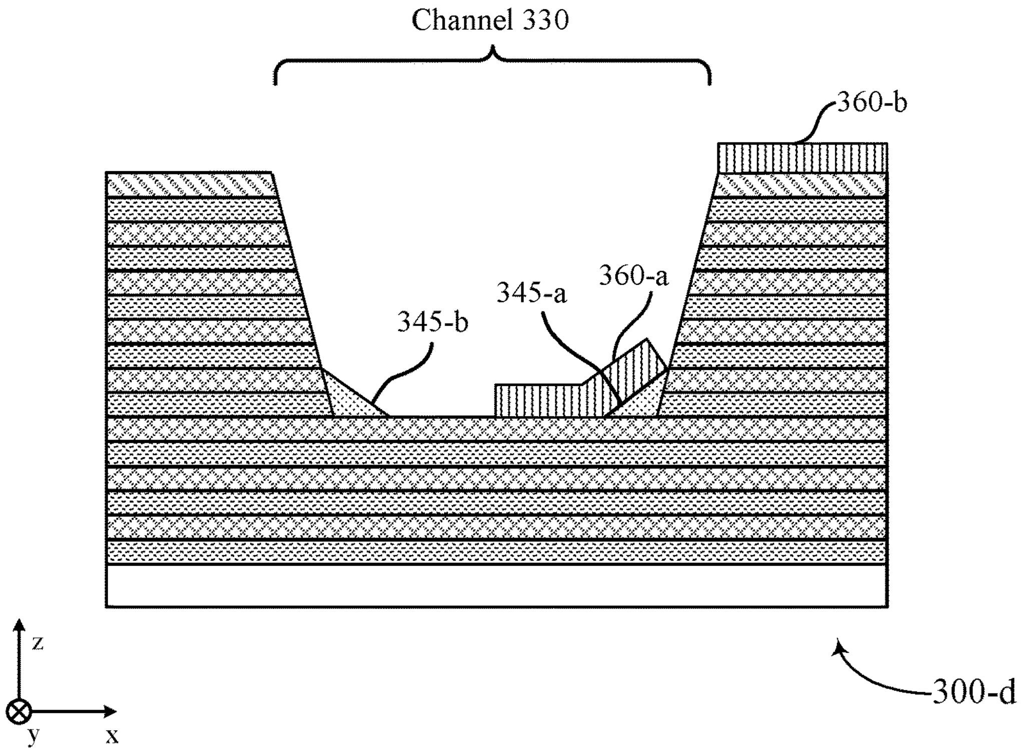

FIG. 3D illustrates a portion of a layout 300-*d* after a fourth set of one or more manufacturing operations. The fourth set of manufacturing operations may include further operations (e.g., etch operations) that support staircase structures for accessing 3D memory arrays in accordance with examples as disclosed herein. For example, the fourth set of manufacturing operations may include the removal (e.g., etching) of the non-implanted nitride material 354 and a portion of the implanted nitride material 356 to form the implanted nitride material 360-*a* and 360-*b*.

For instance, the remaining non-implanted nitride material 354 may be etched, along with the portion of the implanted nitride material 356 which has characteristics similar to those of the non-implanted nitride material 354 (e.g., the implanted nitride material 356 over the first sidewall 350 of the channel 330), for example, based on the third quantity of doping material 358 with which this portion of implanted nitride material 356 is implanted failing to satisfy (e.g., being less than, less than or equal to) a threshold quantity of doping material 358.

In some examples, this etching operation may result in the exposure of the sidewalls 350 of the channel 330, the exposure of a portion of the bottom of the channel 330, the exposure of the corner oxide 345-*b*, the exposure of a portion of the top dielectric material 325 on top of the stack of layers 310, or a combination thereof. In some examples, these exposures may result in portions of the implanted nitride material 356 remaining (e.g., implanted nitride material 360-*a* and 360-*b*). As such, the implanted nitride material 360-*a* may remain over the corner oxide 345-*a* and a portion of the bottom of the channel 330, and the implanted nitride material 360-*b* may remain on top of the top dielectric material 325.

In some examples, the implanted nitride material 360-*a* may remain over the corner oxide 345-*a* based on the second quantity of doping material 358 with which this portion of implanted nitride material 360-*a* is implanted satisfying (e.g., being greater than, being greater than or equal to) a threshold quantity of doping material 358. That is, the implanted nitride material 356 over the corner oxide 345-*a* may be implanted such that it may resist the etching of the non-implanted nitride material 354. In some other examples, a portion of the implanted nitride material 356 over the corner oxide 345-*a* may be etched based on the second quantity of doping material 358 with which this portion of implanted nitride material 360-*a* is implanted failing to satisfy the threshold quantity of doping material 358. However here, the corner oxide 345-*a* may remain in the channel 330 after the etch. Thus, in either example, the first bottom corner of the channel 330 (e.g., the junction between the) may remain unexposed after the etch of the non-implanted nitride material 354).

Figure 3E:
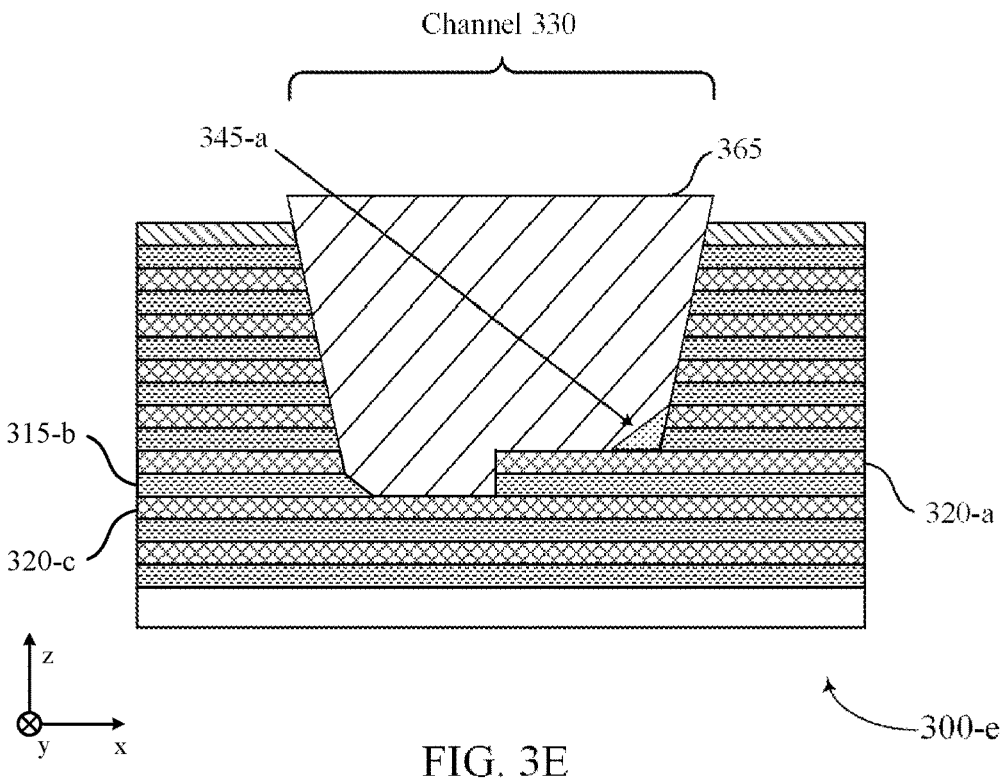

FIG. 3E illustrates a portion of a layout 300-*e* after a fifth set of one or more manufacturing operations. The fifth set of manufacturing operations may include further operations (e.g., etch operations, deposition operations) that support staircase structures for accessing 3D memory arrays in accordance with examples as disclosed herein. For example, the fifth set of manufacturing operations may include the removal (e.g., etching) of the implanted nitride material 360-*a* and 360-*b*, as well as specific portions of layers of the stack of layers 310. The fifth set of manufacturing operations may also include the formation (e.g., deposition) of a fill material 365.

For example, the implanted nitride materials 360-*a* and 360-*b* may be etched such that at least a portion of the corner oxide 345-*a* remains in the channel 330 (and the implanted nitride material 360-*b* is removed from the top of the stack of layers 310), thus exposing a portion of the sacrificial material 320-*a* over which the implanted nitride material 360-*a* was located. In some examples, a portion of the bottom of the channel 330 may also be etched such that the channel 330 may be partitioned (e.g., bisected). For example, as part of the etch operation to remove the implanted nitride materials 360, the corner oxide 345-*b* and portions of the sacrificial material 320-*a* and a dielectric material 315-*b* over which the sacrificial material 320-*a* is located may be etched such that a portion of a sacrificial material 320-*c* may be exposed, as illustrated. For instance, a portion of the sacrificial material 320-*a* that is uncovered by the implanted nitride material 360 as well as a portion of the dielectric material 315-*b* underneath the uncovered portion of the sacrificial material 320-*a* in the z-direction may be etched. As such, a step may be formed in the side of the channel 330 uncovered by the implanted nitride material 360-*a*, where the step is from the sacrificial material 320-*c* to the sacrificial material 320-*a*. The corner oxide 345-*b* may be etched based on having been exposed with the etch of the non-implanted nitride material 354.

During the etch operation to bisect the channel 330, a trench in the first bottom corner of the channel 330 may be prevented from forming based on the corner oxide 345-*a*. For example, without the presence of the corner oxide 345-*a*, an implantation of nitride material 354 located in the first bottom corner may be relatively ineffective, for example, due to an angle of the nitride material 354 relative to the direction of implantation being relatively low. As a result, the implanted nitride material 356 located in the first bottom corner may be etched, thereby exposing the sacrificial material 320-*a* in the first bottom corner. Here, the sacrificial material 320-*a* (e.g., and the dielectric material 315-*b*) located in the first bottom corner may be etched during bisection of the channel 330 based on being uncovered by the implanted nitride material 360-*a* (e.g., and/or a corner oxide 345) such that the trench (e.g., a cavity to the dielectric material 315-*b* or sacrificial material 320-*c* in the first bottom corner) may be formed. During the deposition of the fill material 365, the trench may be filled with the fill material 365. The corner oxide 345-*a*, however, may enable implantation of the nitride material 354 in the first bottom corner such that the trench is not formed during bisection of the channel 330. Further, even if a portion of the corner oxide 345-*a* is exposed as a result of etching the non-implanted nitride material 354, the corner oxide 345-*a* and the implanted nitride material 360-*a* that does cover a portion of corner oxide 345-*a* may provide sufficient protection to prevent formation of the trench.

In some examples, the fifth set of manufacturing operations may include subsequently filling the channel 330 with another material. For example, after the etch operation (e.g., bisection of the channel 330), the channel 330 (e.g., including the step) may be filled with a fill material 365. As such, the fill material 365 may cover the remaining corner oxide 345-*a*, along with the exposed surfaces of the sacrificial material 320, sidewalls 350 of the channel 330, and all other aspects of the channel 330. In some examples, the fill material 365 may be in contact with at least a portion of the corner oxide 345-*a*. In some other cases, an intermediate material may be between the fill material 365 and the corner oxide 345-*a* to separate them. The fill material 365 may be an example of an oxide material different than that of the channel material 335 as described with reference to FIG. 3A and others. In some examples, the fill material 365 may be associated with an etch rate, density, or a combination thereof that is different than the etch rate, density, or a combination thereof, of the channel material 335.

Figure 3F:
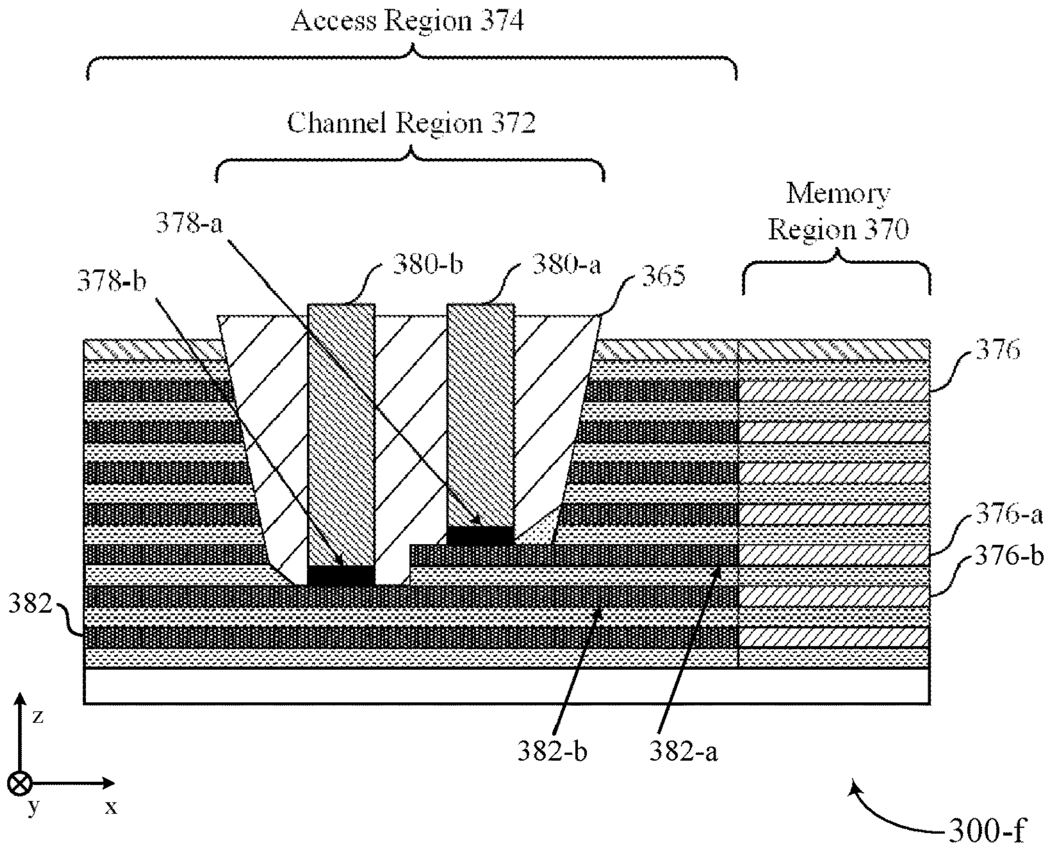

FIG. 3F illustrates a portion of a layout 300-*f* after a sixth set of one or more manufacturing operations. The sixth set of manufacturing operations may include further operations (e.g., etch operations, deposition operations) that support staircase structures for accessing 3D memory arrays in accordance with examples as disclosed herein. For example, the sixth set of manufacturing operations may include the removal (e.g., etching) of portions of the fill material 365 and the sacrificial material 320. The sixth set of manufacturing operations may also include the formation (e.g., deposition) of a conductive contacts 378, a conductive pillars 380, and a word lines 382.

In some examples, the sixth set of manufacturing operations may include removing (e.g., etching) the sacrificial material 320. For example, the layers of the sacrificial material 320 may be removed, and the regions once filled with (e.g., locations of the removed) sacrificial material 320 may be filled with one or more conductive (e.g., metal) materials to form respective word lines 382. For example, the sacrificial material 320-*a* and the sacrificial material 320-*c* may be removed, and a word line 382-*a* and a word line 382-*b* may be formed at the location of the sacrificial material 320-*a* and the sacrificial material 320-*c*, respectively.

The word lines 382 may extend into a memory region 370 over the substrate 305 of the layout 300 and may be used to access memory cells at respective levels of memory cells 376. For example, the memory region 370 may include alternating layers of dielectric material 315 and levels of memory cells 376. Aspects of the memory region 370 may be formed in conjunction with the various sets of manufacturing operations (e.g., the first through sixth set of manufacturing operations). In the example of FIG. 3F, the word line 382-*a* may extend into a level of memory cells 376-*a* and may be used to access one or more memory cells of the level of memory cells 376-*a* that are coupled with the word line 382-*a*. Additionally, the word line 382-*b* may extend into a level of memory cells 376-*b* and may be used to access one or more memory cells of the level of memory cells 376-*b* that are coupled with the word line 382-*b*.

In some examples, the fill material 365 may be in contact with word line 382-*a* and word line 382-*b*. In some other examples, the word line 382-*a* and the word line 382-*b* may each be separated from the fill material 365 by an intermediate material (not shown).

The sixth set of manufacturing operations may further include etching portions of the fill material 365 in the z-direction to form a first cavity (illustrated as filled with a conductive pillar 380-*a* and a conductive contact 378-*a*) and a second cavity (illustrated as filled with a conductive pillar 380-*b* and a conductive contact 378-*b*). The first cavity may extend from the top surface of the fill material 365 to the word line 382-*a*, and the second cavity may extend from the top surface of the fill material 365 to the word line 382-*b*. In some examples, some or all of the corner oxide 345-*a* may be etched as part of etching the first cavity. In some examples, the corner oxide 345-*a* may be unetched by the etching of the first cavity.

The sixth set of manufacturing operations may include forming conductive contacts 378 (e.g., metal contacts) and conductive pillars 380 in the etched cavities. For example, the conductive contact 378-*a* may be formed (e.g., deposited) in the base of the first cavity and a conductive material (e.g., metal) may be formed over the conductive contact 378-*a* in the first cavity to form the conductive pillar 380-*a*. The conductive contact 378-*b* and the conductive pillar 380-*b* may be similarly formed in the second cavity (e.g., as part of the same deposition processes to form the conductive contact 378-*a* and the conductive pillar 380-*a*, respectively).

The conductive contacts 378 may be in contact with (e.g., coupled with) the corresponding word lines 382 and conductive pillars 380. For example, the conductive contacts 378 may be in contact with a portion of the conductive pillars 380 and a top surface of the word lines 382. The conductive contacts 378 may also be in contact with the fill material 365.

In some examples, the corner oxide 345-*a* may be in contact with the conductive contact 378-*a*, the conductive pillar 380-*a*, the word line 382-*a*, or a combination thereof. For example, based on the etch of the first cavity, a portion of the corner oxide 345-*a* may be exposed. As a result, the conductive contact 378-*a*, the conductive pillar 380-*a*, or both, may be in contact with the exposed portion of the corner oxide 345-*a* after being deposited. In some other examples, the first cavity may be etched such that the corner oxide 345-*a* is unetched and unexposed (e.g., covered by the fill material 365. Here, the conductive contact 378-*a*, the conductive pillar 380-*a*, or both, may be adjacent to the corner oxide 345-*a* (e.g., in the x-direction) but separated from the corner oxide 345-*a* by a portion of the fill material 365. In some examples, the word line 382-*a* may be formed such that the corner oxide 345-*a* is in contact with the top surface of the word line 382-*a*. In some examples, an intermediate material may separate the corner oxide 345-*a* from the top surface of the word line 382-*a*. In the example of FIG. 3F, the corner oxide 345-*a* may be in contact with the word line 382-*a* and a portion of the conductive contact 378-*a* but may be separated from the conductive pillar 380-*a* by a portion of the fill material 365.

The layout 300 may support accessing the levels of memory cells 376 based on forming the conductive contacts 378 and conductive pillars 380. For example, the layout 300 may include a channel region 372 and an access region 374. The access region 374 may correspond to a staircase region of the layout 300. That is, the access region 374 may be a region of the layout 300 where access circuitry (e.g., word lines 382) and circuitry to couple the access circuitry with decoder circuitry may be located. The channel region 372 may correspond to a region of the access region 374 that includes the materials and components formed in the channel 330 (e.g., the fill material 365, the corner oxide 345-*a*, the conductive contacts 378, and the conductive pillars 380). Each level of memory cells 376 may be coupled with a word line 382 in the access region 374, which may be coupled with the conductive contacts 378 and the conductive pillars 380 in the channel region 372 to support accessing a given level of memory cells 376. For example, voltages applied to the word line 382-*a* by decoding circuitry (e.g., a row decoder 160) via the conductive contact 378-*a* and the conductive pillar 380-*a* may result in accessing memory cells of the level of memory cells 376-*a* of the memory region 370.

In some examples, the use of the corner oxide 345-*a* may prevent trench formation from occurring during bisection of the channel 330 as described with reference to FIG. 3D. Formation of such a trench may result in electric isolation of the word line 382-*a* from the conductive contact 378-*a* (e.g., and conductive pillar 380-*a*) such that the word line 382-*a* may not be coupled with the decoding circuitry, and thus may be rendered useless in accessing the memory region 370. For example, because the fill material 365 may fill the trench when deposited after bisecting the channel 330, the sacrificial material 320-*a* located in the channel 330 may be blocked by the fill material 365 in the trench from being removed and replaced by the word line 382-*a*. Thus, the conductive contact 378-*a* deposited in the first cavity may be uncoupled from (e.g., physically and/or electrically isolated from) the word line 382-*a*. However, utilizing the corner oxide 345-*a* may prevent the trench from forming by acting as a physical buffer (e.g., margin) and/or enabling increased implantation of the nitride material 354 located over the first bottom corner, and thus may prevent the electrical isolation of the word line 382-*a*. Thus, proper functionality of the word line 382-*a* in regards to accessing the memory cell 376-*a* of the memory region 370 may be supported in addition to the bisection of the channel 330.

Figure 4:
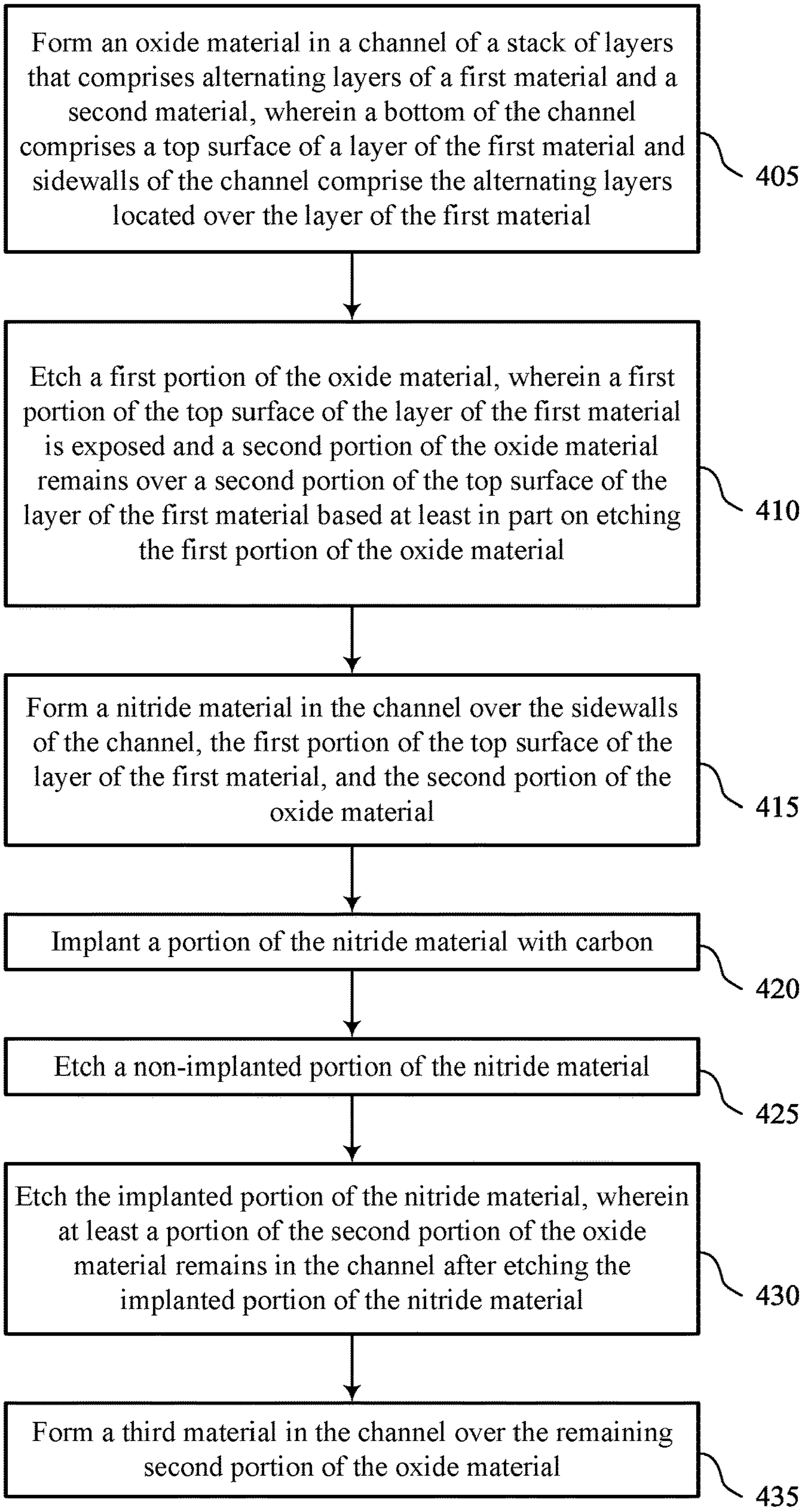
FIG. 4 shows a flowchart illustrating a method or methods that support staircase structures for accessing 3D memory arrays in accordance with examples as disclosed herein.

FIG. 4 shows a flowchart illustrating a method 400 that staircase structures for accessing 3D memory arrays in accordance with examples as disclosed herein. The operations of method 400 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 405, the method may include forming an oxide material in a channel of a stack of layers that includes alternating layers of a first material and a second material, where a bottom of the channel includes a top surface of a layer of the first material and sidewalls of the channel include the alternating layers located over the layer of the first material. The operations of 405 may be performed in accordance with examples as disclosed herein.

At 410, the method may include etching a first portion of the oxide material, where a first portion of the top surface of the layer of the first material is exposed and a second portion of the oxide material remains over a second portion of the top surface of the layer of the first material based at least in part on etching the first portion of the oxide material. The operations of 410 may be performed in accordance with examples as disclosed herein.

At 415, the method may include forming a nitride material in the channel over the sidewalls of the channel, the first portion of the top surface of the layer of the first material, and the second portion of the oxide material. The operations of 415 may be performed in accordance with examples as disclosed herein.

At 420, the method may include implanting a portion of the nitride material with carbon. The operations of 420 may be performed in accordance with examples as disclosed herein.

At 425, the method may include etching a non-implanted portion of the nitride material. The operations of 425 may be performed in accordance with examples as disclosed herein.

At 430, the method may include etching the implanted portion of the nitride material, where at least a portion of the second portion of the oxide material remains in the channel after etching the implanted portion of the nitride material. The operations of 430 may be performed in accordance with examples as disclosed herein.

At 435, the method may include forming a third material in the channel over the remaining second portion of the oxide material. The operations of 435 may be performed in accordance with examples as disclosed herein.

In some examples, an apparatus (e.g., a manufacturing system) as described herein may perform a method or methods, such as the method 400. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming an oxide material in a channel of a stack of layers that includes alternating layers of a first material and a second material, where a bottom of the channel includes a top surface of a layer of the first material and sidewalls of the channel include the alternating layers located over the layer of the first material; etching a first portion of the oxide material, where a first portion of the top surface of the layer of the first material is exposed and a second portion of the oxide material remains over a second portion of the top surface of the layer of the first material based at least in part on etching the first portion of the oxide material; forming a nitride material in the channel over the sidewalls of the channel, the first portion of the top surface of the layer of the first material, and the second portion of the oxide material; implanting a portion of the nitride material with carbon; etching a non-implanted portion of the nitride material; etching the implanted portion of the nitride material, where at least a portion of the second portion of the oxide material remains in the channel after etching the implanted portion of the nitride material; and forming a third material in the channel over the remaining second portion of the oxide material.

Aspect 2: The method or apparatus of aspect 1, further including operations, features, circuitry, logic, means, or instructions, or any combination thereof for removing the layer of the first material and forming, at a location of the removed layer of the first material, a word line associated with accessing one or more memory cells, where the remaining second portion of the oxide material is in contact with a top surface of the word line.

Aspect 3: The method or apparatus of aspect 2, further including operations, features, circuitry, logic, means, or instructions, or any combination thereof for etching a cavity through the third material to the word line and forming, in the cavity, a contact and a conductive pillar coupled with the word line, the contact and the conductive pillar for coupling the word line with decoder circuitry, where the remaining second portion of the oxide material is in contact with the contact, or the conductive pillar, or both.

Aspect 4: The method or apparatus of any of aspects 1 through 3, where the second portion of the oxide material includes a first sub-portion and a second sub-portion and the implanted portion of the nitride material is located over the first sub-portion of the oxide material and the non-implanted portion of the nitride material is located over the second sub-portion of the oxide material.

Aspect 5: The method or apparatus of aspect 4, where the first sub-portion of the oxide material is located in a first bottom corner of the channel and the second sub-portion of the oxide material is located in a second bottom corner of the channel that is opposite the first bottom corner and the first portion of the top surface of the layer of the first material is located between the first sub-portion of the oxide material and the second sub-portion of the oxide material.

Aspect 6: The method or apparatus of any of aspects 4 through 5, where etching the implanted portion of the nitride material includes operations, features, circuitry, logic, means, or instructions, or any combination thereof for etching the second sub-portion of the oxide material based at least in part on the etch of the non-implanted portion of the nitride material exposing the second sub-portion of the oxide material, where the remaining second portion of the oxide material is the first sub-portion of the oxide material based at least in part on etching the second sub-portion of the oxide material.

Aspect 7: The method or apparatus of any of aspects 1 through 6, where different portions of the implanted portion of the nitride material include different quantities of implanted carbon.

Aspect 8: The method or apparatus of aspect 7, where a first portion of the implanted portion of the nitride material that is over the first portion of the top surface of the layer of the first material is implanted with a first quantity of carbon; a second portion of the implanted portion of the nitride material that is over the second portion of the oxide material is implanted with a second quantity of carbon that is less than the first quantity of carbon; and a third portion of the implanted portion of the nitride material that is over a first sidewall of the channel is implanted with a third quantity of carbon that is less than the second quantity of carbon.

Aspect 9: The method or apparatus of aspect 8, where the first quantity of carbon is greater than the second quantity of carbon based at least in part on a first angle of the first portion of the implanted portion of the nitride material relative to a direction of the implanting being greater than a second angle of the second portion of the implanted portion of the nitride material relative to the direction of the implanting and the second quantity of carbon is greater than the third quantity of carbon based at least in part on the second angle being greater than a third angle of the third portion of the implanted portion of the nitride material relative to the direction of the implanting.

Aspect 10: The method or apparatus of any of aspects 8 through 9, where etching the non-implanted portion of the nitride material includes operations, features, circuitry, logic, means, or instructions, or any combination thereof for etching the third portion of the implanted portion of the nitride material that is over the first sidewall of the channel based at least in part on the third quantity of carbon failing to satisfy a threshold quantity of implanted carbon.

Aspect 11: The method or apparatus of any of aspects 1 through 10, where etching the implanted portion of the nitride material includes operations, features, circuitry, logic, means, or instructions, or any combination thereof for etching a first portion of the layer of the first material exposed based at least in part on etching the non-implanted portion of the nitride material, where a second portion of the layer of the first material is unetched based at least in part on the remaining second portion of the oxide material being over the second portion of the layer of the first material and etching a first portion of a layer of the second material that is under the first portion of the layer of the first material.

Aspect 12: The method or apparatus of any of aspects 1 through 11, where the second portion of the oxide material is in contact with the second portion of the top surface of the layer of the first material, one or more sidewalls of the channel, or any combination thereof.

Aspect 13: The method or apparatus of any of aspects 1 through 12, where an intermediate material separates the second portion of the oxide material from the second portion of the top surface of the layer of the first material, one or more sidewalls of the channel, or any combination thereof Aspect 14: The method or apparatus of any of aspects 1 through 13, where the first material includes a sacrificial material for replacement by a word line and the second material includes a dielectric material.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 15: An apparatus, including: a substrate; a memory region over the substrate and including a plurality of levels of memory cells; an access region over the substrate and including: a plurality of word lines associated with accessing the plurality of levels of memory cells; a conductive pillar for coupling a first word line at a first level of memory cells with decoder circuitry in association with accessing a set of memory cells at the first level, where the conductive pillar is located in a channel region between word lines at levels over the first level and for providing access to the first word line, and where the conductive pillar extends, in a first direction orthogonal to the substrate, from the first word line through a fill material in the channel region over the first word line; and an oxide material in contact with the first word line and a dielectric material located between the first level and a second level of memory cells over the first level.

Aspect 16: The apparatus of aspect 15, where the access region further includes: a metal contact coupled with the first word line and the conductive pillar, where the oxide material is in contact with the metal contact, the conductive pillar, or any combination thereof.

Aspect 17: The apparatus of any of aspects 15 through 16, where a portion of the fill material is located between the oxide material and the conductive pillar in a second direction parallel to the substrate.

Aspect 18: The apparatus of any of aspects 15 through 17, further including: a second conductive pillar for coupling a second word line at a third level of memory cells with the decoder circuitry, where the second conductive pillar is located in the channel region and extends from the second word line through the fill material.

Aspect 19: The apparatus of any of aspects 15 through 18, where the fill material includes a second oxide material different from the oxide material.

Aspect 20: The apparatus of any of aspects 15 through 19, where: the fill material is associated with a first etch rate, a first density, or any combination thereof, and the oxide material is associated with a second etch rate different from the first etch rate, a second density different from the first density, or any combination thereof.

An apparatus is described. The following provides an overview of aspects of the apparatus as described herein:

Aspect 21: An apparatus, including: a substrate; a plurality of word lines over the substrate and separated from each other by respective dielectric layers; a contact coupled with a first word line of the plurality of word lines; a conductive pillar coupled with the contact and for coupling the first word line with decoder circuitry, the conductive pillar extending through a first oxide material located over the first word line; and a second oxide material over the first word line and adjacent to a first dielectric layer that is over the first word line.

Aspect 22: The apparatus of aspect 21, further including: a second contact coupled with a second word line of the plurality of word lines; and a second conductive pillar coupled with the second contact and for coupling the second word line with the decoder circuitry, the second conductive pillar extending through the first oxide material, where the conductive pillar and the second conductive pillar are located in a channel region that is between word lines over the first word line and the second word line and is for providing access to the first word line and the second word line.

Aspect 23: The apparatus of any of aspects 21 through 22, where the second oxide material is in contact with the first word line, the first dielectric layer, or any combination thereof.

Aspect 24: The apparatus of any of aspects 21 through 22, where the second oxide material is separated from the first word line, the first dielectric layer, or any combination thereof, by an intermediate material.

Aspect 25: The apparatus of any of aspects 21 through 24, where the second oxide material is in contact with the contact, the conductive pillar, or any combination thereof.

Aspect 26: The apparatus of any of aspects 21 through 24, where the second oxide material is adjacent to the contact and separated from the contact by a portion of the first oxide material in a first direction that is parallel to the substrate.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and include a three terminal device including a source, drain, and gate. The terminals may be connected to other electronic elements through conductive materials, e.g., metals. The source and drain may be conductive and may include a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can include RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:

a substrate;

a memory region over the substrate and comprising a plurality of levels of memory cells; and an access region over the substrate and comprising:

a plurality of word lines associated with accessing the plurality of levels of memory cells;

a conductive pillar for coupling a first word line at a first level of memory cells with decoder circuitry in association with accessing a set of memory cells at the first level, wherein the conductive pillar is located in a channel region between word lines at levels over the first level and for providing access to the first word line, and wherein the conductive pillar extends, in a first direction orthogonal to the substrate, from the first word line through a fill material in the channel region over the first word line;

a metal contact in contact with the first word line and the conductive pillar; and an oxide material in contact with the first word line and a dielectric material located between the first level and a second level of memory cells over the first level, wherein the oxide material is different from the dielectric material and is in contact with the metal contact, the conductive pillar, and the first word line.

2. The apparatus of claim 1, wherein a portion of the fill material is located between the oxide material and the conductive pillar in a second direction parallel to the substrate.

3. The apparatus of claim 1, further comprising:

a second conductive pillar for coupling a second word line at a third level of memory cells with the decoder circuitry, wherein the second conductive pillar is located in the channel region and extends from the second word line through the fill material.

4. The apparatus of claim 1, wherein the fill material comprises a second oxide material different from the oxide material.

5. The apparatus of claim 1, wherein:

the fill material is associated with a first etch rate, a first density, or any combination thereof, and the oxide material is associated with a second etch rate different from the first etch rate, a second density different from the first density, or any combination thereof.

6. An apparatus, comprising:

a substrate;

a plurality of word lines over the substrate and separated from each other by respective dielectric layers;

a contact coupled with a first word line of the plurality of word lines;

a conductive pillar coupled with the contact and for coupling the first word line with decoder circuitry, the conductive pillar extending through a first oxide material located over the first word line; and a second oxide material over the first word line and adjacent to a first dielectric layer that is over the first word line, wherein the second oxide material is in contact with the first word line and the first dielectric layer.

7. The apparatus of claim 6, further comprising:

a second contact coupled with a second word line of the plurality of word lines; and a second conductive pillar coupled with the second contact and for coupling the second word line with the decoder circuitry, the second conductive pillar extending through the first oxide material, wherein the conductive pillar and the second conductive pillar are located in a channel region that is between word lines over the first word line and the second word line and is for providing access to the first word line and the second word line.

8. The apparatus of claim 6, wherein the second oxide material is in contact with the contact, the conductive pillar, or any combination thereof.

9. The apparatus of claim 6, wherein the second oxide material is adjacent to the contact and separated from the contact by a portion of the first oxide material in a first direction that is parallel to the substrate.

* * * * *